United States Patent [19]
Cheng et al.

[11] Patent Number: 6,086,777
[45] Date of Patent: Jul. 11, 2000

[54] TANTALUM BARRIER METAL REMOVAL BY USING $CF_4/O_2$ PLASMA DRY ETCH

[75] Inventors: Jerry Cheng, Milpitas; Fei Wang, San Jose, both of Calif.

[73] Assignee: Advanced Micro Devices, Inc., Sunnyvale, Calif.

[21] Appl. No.: 09/108,783

[22] Filed: Jul. 2, 1998

[51] Int. Cl.[7] ..................................................... C23F 1/10
[52] U.S. Cl. ................................. 216/67; 216/72; 216/75
[58] Field of Search .................... 216/67, 72, 75

[56] References Cited

U.S. PATENT DOCUMENTS

| | | | |
|---|---|---|---|
| Re. 35,416 | 12/1996 | Suzuki et al. | 349/41 |
| 5,274,482 | 12/1993 | Morita et al. | 349/51 |
| 5,409,566 | 4/1995 | Kim | 216/48 |
| 5,431,773 | 7/1995 | Ikeda et al. | 216/23 |
| 5,447,887 | 9/1995 | Filipiak et al. | 437/200 |
| 5,496,608 | 3/1996 | Matsuda et al. | 428/64.1 |
| 5,612,254 | 3/1997 | Mu et al. | 437/195 |
| 5,663,608 | 9/1997 | Jones et al. | 313/309 |
| 5,674,787 | 10/1997 | Zhao et al. | 437/230 |
| 5,700,737 | 12/1997 | Yu et al. | 438/636 |
| 5,739,579 | 4/1998 | Chiang et al. | 257/635 |
| 5,814,238 | 9/1998 | Ashby et al. | 216/62 |
| 5,818,549 | 10/1998 | Maruyama et al. | 349/42 |
| 5,914,758 | 6/1999 | Kishida et al. | 349/51 |

OTHER PUBLICATIONS

Seki, Shunji, Takashi Unagami and Bunjiri Tsujiyama, "Reactive Ion Etching Of Tantalum Pentoxide", Journal of the Electrochemical Society, Dec. 1983, pp. 2505–2506.

*Primary Examiner*—Randy Gulakowski
*Assistant Examiner*—Allan Olsen
*Attorney, Agent, or Firm*—Renner, Otto, Boisselle & Sklar, LLP

[57] ABSTRACT

In one embodiment, the present invention relates to a method of etching tantalum disposed over a dielectric layer, involving etching at least a portion of the tantalum using a tantalum etch gas mixture containing from about 300 sccm to about 400 sccm of $CF_4$ and about 200 sccm to about 600 sccm of oxygen at a temperature from about 100° C. to about 150° C. under a pressure from about 1 torr to about 1.5 torr. In another embodiment, the present invention relates to a method of etching at least a portion of a tantalum barrier layer, the tantalum barrier layer at least partially surrounding a copper or copper alloy interconnect, involving etching at least a portion of the tantalum barrier layer using a tantalum etch gas mixture containing from about 300 sccm to about 400 sccm of $CF_4$ and about 200 sccm to about 600 sccm of oxygen.

8 Claims, 3 Drawing Sheets

TANTALUM BARRIER METAL REMOVAL BY USING CF₄/O₂ PLASMA DRY ETCH

TECHNICAL FIELD

The present invention generally relates to processing a semiconductor substrate. In particular, the present invention relates to methods of etching a tantalum barrier layer.

BACKGROUND ART

Conventional semiconductor devices typically comprise a semiconductor substrate, normally made of monocrystalline silicon, and a plurality of dielectric and conductive layers formed thereon. An integrated circuit is formed containing a plurality of conductive patterns comprising conductive lines separated by interwiring spacings, and a plurality of interconnect lines, such as bus lines, bit lines, word lines and logic interconnect lines. Such interconnection lines, made of metal interconnect materials, generally constitute a limiting factor in terms of various functional characteristics of the integrated circuit. As such, there exists a need to provide a reliable interconnection structure capable of achieving higher operating speeds, improved signal-to-noise ratio and improved reliability.

Aluminum and aluminum alloys are extensively used as metal interconnect materials. While aluminum-based materials are one of the materials of choice for use as metal interconnects, there are concerns as to whether aluminum can meet the demands required as circuit density and speeds for semiconductor devices increase. Because of these concerns, other materials are under consideration for use as metal interconnect materials in integrated circuits. Copper is one such material under consideration. Advantages associated with the use of copper as a metal interconnect material include lower susceptibility to electromigration failure (as compared to aluminum) and lower resistivity (also as compared to aluminum).

One of the problems associated with the use of copper as a metal interconnect material is that copper readily diffuses into surrounding dielectric materials, especially silicon dioxide. In order to inhibit copper diffusion into surrounding dielectric materials, barrier-type materials can be provided to surround copper interconnects. For example, a dielectric layer, such as silicon nitride, which is substantially impervious to the diffusion of copper atoms therethrough, may be provided on the upper surface of a copper interconnect. And a conductive barrier layer along the side walls and bottom surface of a copper interconnect may be provided. Tantalum may be used as a conductive barrier layer since it is substantially impervious to the diffusion of copper atoms.

However, there are problems associated with using a tantalum layer as a barrier layer along the side walls and bottom surface of a copper interconnect. One problem involves the removal of tantalum that is deposited on the semiconductor substrate but not surrounding (or partially surrounding) a copper interconnect (not deposited along the side walls and bottom surface of a copper interconnect). Conventionally, such tantalum is removed by chemical mechanical polishing (CMP) techniques. In instances where the semiconductor substrate has a waving surface or the polishing pad of the polisher has a waving surface, CMP may not remove all of the tantalum deposited in areas other than along the side walls and bottom surface of a copper interconnect. This phenomenon is termed bridging. Bridging is undesirable because it is characterized by randomly located conductive regions on the substrate. This degrades the electrical properties of the resultant electronic devices.

Another problem is that CMP techniques for removing tantalum poorly discriminate between tantalum and dielectric layers such silicon dioxide, and between tantalum and copper. This problem results in inadequate interconnect formation as well as poor electrical properties of the resultant electronic devices. It is therefore desirable to have the capability to selectively remove all or portions of a tantalum layer from a semiconductor substrate to the substantial exclusion of other materials.

SUMMARY OF THE INVENTION

The present invention provides methods of etching a tantalum layer, which may be used as a barrier layer preventing copper from undesirably diffusing through a dielectric layer such as silicon dioxide. The present invention also provides methods of etching a tantalum layer, which is partially or entirely disposed over a dielectric layer and under a copper containing layer, that has high selectivity for tantalum versus a dielectric material, copper or copper alloy. The present invention provides methods of effectively isotropically etching a tantalum layer despite profile changes in underlying materials (such as a waving surface). The present invention also provides methods of etching a tantalum layer without deleteriously effecting copper or copper alloys; that is, without corroding copper or copper alloys exposed to the etching environment.

In one embodiment, the present invention relates to a method of etching tantalum disposed over a dielectric layer, involving etching at least a portion of the tantalum using a tantalum etch gas mixture containing from about 300 sccm to about 400 sccm of $CF_4$ and about 200 sccm to about 600 sccm of oxygen at a temperature from about 100° C. to about 150° C. under a pressure from about 1 torr to about 1.5 torr.

In another embodiment, the present invention relates to a method of etching at least a portion of a tantalum barrier layer, the tantalum barrier layer at least partially surrounding a copper or copper alloy interconnect, involving etching at least a portion of the tantalum barrier layer using a tantalum etch gas mixture containing from about 300 sccm to about 400 sccm of $CF_4$ and about 200 sccm to about 600 sccm of oxygen.

In yet another embodiment, the present invention relates to a method of processing a semiconductor substrate, including providing a semiconductor substrate; providing a patterned dielectric layer having a recess over the semiconductor substrate; providing a tantalum layer over the patterned dielectric layer having the recess; providing a copper or copper alloy layer over the tantalum layer; removing a portion of the copper or copper alloy layer not located within the recess of the patterned dielectric layer thereby exposing a portion of the tantalum layer; and etching at least a portion of the exposed tantalum layer not located within the recess of the patterned dielectric layer using a tantalum etch gas mixture containing $CF_4$ and oxygen.

DISCLOSURE OF INVENTION

Figure 1:
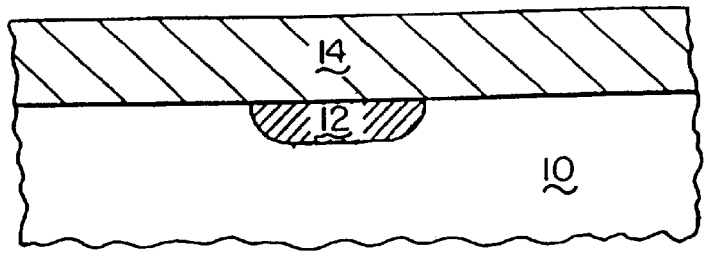
FIG. 1 illustrates a cross-sectional view of a semiconductor substrate having a diffusion region and a dielectric layer according to one aspect of the present invention.

The present invention involves etching a tantalum layer containing tantalum which may be used as a barrier layer partially or entirely surrounding a copper or copper alloy plug, line or other type of interconnect. Copper alloys contain copper and one or more of aluminum, chromium, cobalt, gold, nickel, palladium, platinum, silver, tungsten and zinc. The present invention more specifically involves employing a dry etching process using a combination of gases to etch or remove tantalum without detrimentally affecting the underlying dielectric layer or nearby copper or copper alloy. In the context of the present invention, the combination of gases is termed a "tantalum etch gas mixture".

In one embodiment, the tantalum etch gas mixture is nitrogen-free; that is, the tantalum etch gas mixture does not contain nitrogen gas or a gas component containing nitrogen atoms. In another embodiment, the tantalum etch gas mixture is sulfur-free; that is, the tantalum etch gas mixture does not contain a gas component containing sulfur atoms, such as $SO_2$, $SF_4$ or $SF_6$. In another embodiment, the tantalum etch gas mixture is hydrogen-free; that is, the tantalum etch gas mixture does not contain hydrogen gas or a gas component containing hydrogen atoms.

The tantalum etch gas mixture contains at least two gas components. The two gas components include $CF_4$ and $O_2$. In one embodiment, the tantalum etch gas mixture does not contain a carrier gas. In another embodiment, the tantalum etch gas mixture further contains a carrier gas. Carrier gases are non-reactive gases and generally include gases of the noble elements. Examples of carrier gases include He, Ne, Ar, Kr, Xe and combinations thereof. In a preferred embodiment, the tantalum etch gas mixture contains two gas components.

In one embodiment, the relative amounts of the components of the tantalum etch gas mixture employed are from about 300 standard cubic centimeters per minute (sccm) to about 400 sccm of $CF_4$ and from about 200 sccm to about 600 sccm of oxygen. In another embodiment, the relative amounts of the components of the tantalum etch gas mixture employed are from about 325 sccm to about 375 sccm of $CF_4$ and from about 300 sccm to about 500 sccm of oxygen. In yet another embodiment, the relative amounts of the components of the tantalum etch gas mixture employed are from about 340 sccm to about 360 sccm of $CF_4$ and from about 350 sccm to about 450 sccm of oxygen.

In one embodiment, the amount of $CF_4$ employed is greater than the amount of oxygen employed. In another embodiment, the amount of $CF_4$ employed is less than the amount of oxygen employed. In yet another embodiment, the amount of $CF_4$ employed is about the same as the amount of oxygen employed. In one embodiment, the ratio of $CF_4$ to $O_2$ is from about 0.75:1 to about 0.95:1, and preferably about 0.8:1 to about 0.9:1.

In one embodiment, the temperature, the pressure and the power used during tantalum etching ranges from about 100° C. to about 150° C., from about 1 torr to about 1.5 torr and from about 800 to about 1200 watts. In another embodiment, the temperature, the pressure and the power used during tantalum etching ranges from about 110° C. to about 140° C., from about 1.1 torr to about 1.4 torr and from about 900 to about 1100 watts. In yet another embodiment, the temperature, the pressure and the power used during tantalum etching ranges from about 120° C. to about 130° C., from about 1.2 torr to about 1.3 torr and from about 950 to about 1050 watts.

The tantalum etch gas mixture is contacted with a tantalum layer in the form of a plasma via a reactive ion etch (RIE) apparatus or an electron cyclotron resonance (ECR) plasma reactor. RIE apparatus and ECR plasma reactors are commercially available. A parallel plate RIE apparatus is preferred. Etching a tantalum layer with the tantalum etch gas mixture is an isotropic etch.

FIGS. 1–12 illustrate one embodiment of the methods of the present invention. With regard to the description in connection with the embodiment of FIGS. 1–12, the term substrate includes not only a semiconductor substrate, such as semiconductor substrate 10, but also any and all layers and structures fabricated over the semiconductor substrate up to the point of processing under discussion.

FIGS. 1–12 illustrate a method in connection with forming interconnections that make electrical contact to a diffusion region 12 within a semiconductor substrate 10. However, the method of FIGS. 1–12 may be used to form interconnects for other purposes. For example, the method of FIGS. 1–12 may be adapted to making electrical contacts to various device structures, active elements and passive elements including polysilicon gates, wordlines, source regions, drain regions, bit lines, bases, emitters, collectors, conductive lines, conductive plugs, etc. The method of FIGS. 1–12 may be used with any suitable semiconductor technology including but not limited to NMOS, PMOS, CMOS, BiCMOS, bipolar, multi-chip modules (MCM) and III–IV semiconductors.

Referring to FIG. 1, a semiconductor substrate 10 having diffusion region 12 is provided. Semiconductor substrate 10 may include any suitable semiconductor material, for example, a monocrystalline silicon substrate. Diffusion region 12 may be any suitable doped region, for example, an $N^+$ region. A dielectric layer 14 is formed over the substrate 10. Although typically silicon dioxide, dielectric layer 14 may include any suitable dielectric material or materials, including silicon dioxide, silicon nitride, silicon oxynitride, phosphosilicate glass, borophosphosilicate glass, fluoro polymer, parylene, polyimide, any suitable spin-on glass, or any suitable spin-on polymer. Dielectric layer 14 may be formed to any suitable thickness using any suitable technique that may depend, for instance, on the material or materials used. In the case of silicon dioxide, a chemical vapor deposition (CVD) technique is useful. Also in the case of silicon dioxide, the thickness of the dielectric layer 14 may range, for example, from about 5,000 Å to about 10,000 Å.

Figure 2:
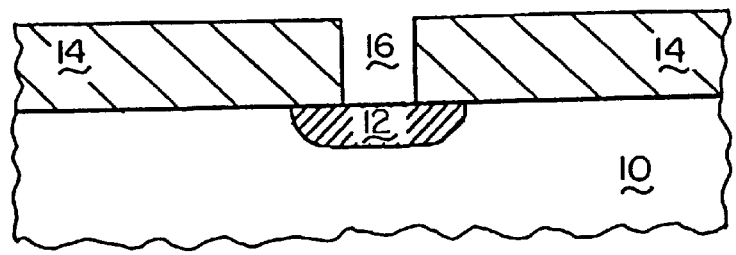
FIG. 2 illustrates a cross-sectional view of the semiconductor substrate of FIG. 1 after the dielectric layer is patterned according to one aspect of the present invention.

Referring to FIG. 2, dielectric layer 14 is patterned to define a contact opening 16 over at least a portion of a device structure, active element or passive element, or the diffusion region 12 in this instance. Any suitable patterning technique may be used to define contact opening 16 in dielectric layer 14. For example, standard photolithographic techniques may be used. In particular, a patterned photoresist layer may be formed over dielectric layer 14 and used as a mask in etching dielectric layer 14 to form contact opening 16. The photoresist layer may then be stripped from the substrate, and the substrate may be optionally cleaned to remove residue from contact opening 16.

Contact opening 16 may be formed to have any desired cross-section, width or diameter, such as about 0.35 μm, about 0.25 μm, about 0.18 μm, about 0.15 μm, about 0.1 μm and/or about 0.05 μm. The contact opening 16 preferably extends to at least a portion of a device structure, active element or passive element, or the diffusion region 12 in this instance exposing at least a portion of the diffusion region 12 in dielectric layer 14.

Figure 3:
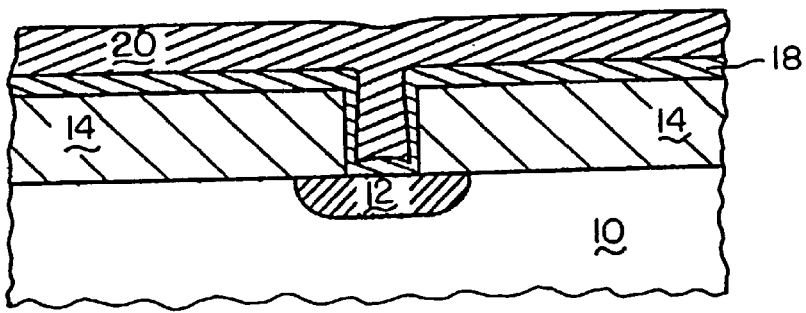
FIG. 3 illustrates a cross-sectional view of the semiconductor substrate of FIG. 2 after a tantalum layer and a conductive layer is formed according to one aspect of the present invention.

Referring to FIG. 3, the contact opening 16 is filled with a tantalum barrier layer 18 and a conductive layer 20. The tantalum barrier layer 18 is a conductive layer that may serve as a diffusion barrier layer preventing conductive material of the conductive layer 20 from diffusing into the diffusion region 12 or into the dielectric layer 14. The tantalum barrier layer 18 is formed over the substrate so that it covers the side walls and bottom in the contact opening 16. The tantalum barrier layer 18 may be formed using any suitable technique to a thickness sufficient to serve as a diffusion barrier for conductive layer 20. For example, the thickness of the tantalum barrier layer 18 may be in the range from about 300 Å to about 500 Å.

Conductive layer 20 is then formed over the substrate, substantially filling contact opening 16. The conductive layer may be made of any suitable conductive material or materials. Examples of suitable conductive materials include copper, tungsten, gold, silver, aluminum, any alloys and/or combinations thereof. In this embodiment, the conductive material is copper or a copper alloy. The conductive layer 20 may be formed to any suitable thickness using any suitable technique. For example, the thickness of the conductive layer 20 may range from about 0.1 μm to about 2 μm.

The tantalum barrier layer 18 and the conductive layer 20 may be deposited using CVD techniques. Alternatively, when copper is used as the conductive layer, the surface of the tantalum layer may be activated using copper atoms (copper seeds) by contact displacement followed by the autocatalytic deposition of electrolessly deposited copper.

Figure 4:
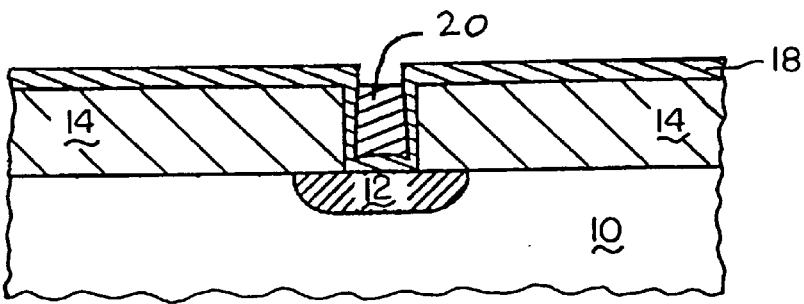
FIG. 4 illustrates a cross-sectional view of the semiconductor substrate of FIG. 3 after the conductive layer overlying the dielectric layer is removed according to one aspect of the present invention.

Referring to FIG. 4, conductive layer 20 is planarized to the surface of the tantalum barrier layer 18; that is, portions of the conductive layer 20 are removed from the top surface of tantalum barrier layer 18 above dielectric layer 14. Contact opening 16 remains substantially filled with a contact plug including portions of the tantalum barrier layer 18 and conductive layer 20. Any suitable technique may be used to planarize the substrate and may depend, for instance, on the specific identity of the material used to make the conductive layer 20. In one embodiment, the substrate is planarized (a portion of the conductive layer is removed) using CMP techniques using a polishing solution or slurry depending upon the specific identity of the materials used for the conductive layer 20. As a result of CMP techniques, dishing occurs wherein the conductive layer 20 is removed to a level below the top surface of the tantalum barrier layer 18, and in some instances, to a level just below the top surface of the dielectric layer 14.

Figure 5:
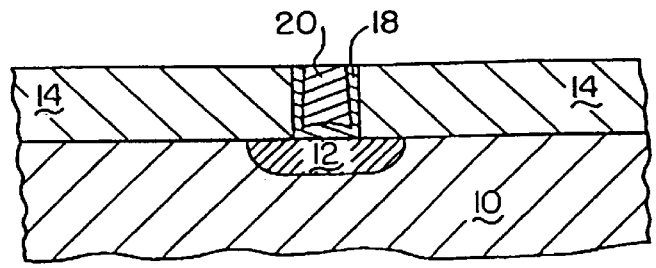
FIG. 5 illustrates a cross-sectional view of the semiconductor substrate of FIG. 4 after the tantalum layer overlying the dielectric layer is removed according to one aspect of the present invention.

Referring to FIG. 5, the portion of the tantalum barrier layer exposed over the dielectric layer 14 is removed using a tantalum etch gas mixture. The etching is performed using, for example, a two component gas combination of 350 sccm $CF_4$ and 400 sccm $O_2$ at a temperature of 125° C. under a pressure of 1.25 torr using about 1000 watts of power. After the portion of the tantalum barrier layer exposed over the dielectric layer 14 is removed, the substrate may be cleaned using conventional techniques such as wet cleaning techniques. Removal of the exposed portion of the tantalum barrier layer serves to planarize the substrate while leaving undisturbed the portion of the tantalum barrier layer 18 surrounding conductive layer 20. The tantalum etch gas mixture has high etch selectivity for tantalum as compared to a dielectric material such as silicon dioxide, which may constitute the dielectric layer 14 as well as other conductive metals such as copper or copper alloys, which may constitute the conductive layer 20. The tantalum etch gas mixture provides a selective etch such that the conductive layer 20 serves as a mask in etching the tantalum barrier layer 18. The tantalum etch gas mixture etches in an isotropic manner whereby there is no or very little change in side wall profile of the conductive layer 20.

When the underlying dielectric layer 14 is exposed to the tantalum etch gas mixture, the underlying dielectric layer 14 is preferably made of silicon dioxide so that it may serve as an etch-stop during etching of the tantalum barrier layer 18. In one embodiment, the tantalum etch gas mixture has a tantalum:dielectric layer etch selectivity of at least about 3:1. In another embodiment, the tantalum etch gas mixture has a tantalum:dielectric layer etch selectivity of at least about 4:1. In one embodiment, the tantalum etch gas mixture has a tantalum:conductive layer etch selectivity of at least about 60:1. In another embodiment, the tantalum etch gas mixture has a tantalum:conductive layer etch selectivity of at least about 70:1. Since the tantalum layer is partially removed by etching rather than using CMP techniques, bridging is not observed. In this embodiment, the tantalum etch gas mixture has a tantalum:dielectric layer etch selectivity of at least about 3.5:1 and a tantalum:conductive layer etch selectivity of at least about 65:1.

Figure 6:
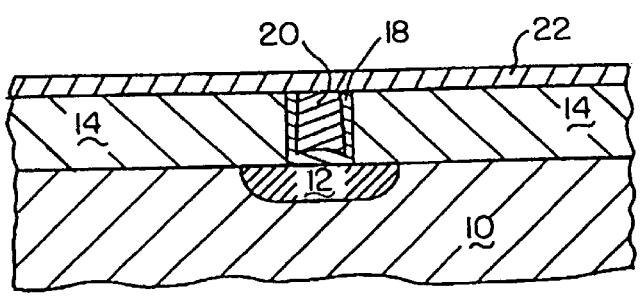
FIG. 6 illustrates a cross-sectional view of the semiconductor substrate of FIG. 5 after a dielectric etch stop layer is formed according to one aspect of the present invention.

Referring to FIG. 6, a dielectric etch stop layer 22 is formed over the substrate. A dielectric etch-stop layer serves as an etch resistant layer for a subsequent dielectric etch step. The dielectric etch stop layer 22 may be formed of any suitable material to any suitable thickness using any suitable technique. For example, the dielectric etch stop layer 22 may be formed using CVD techniques, such as low pressure chemical vapor deposition (LPCVD) or plasma enhanced chemical vapor deposition (PECVD). In one embodiment, the dielectric etch stop layer 22 is formed to a thickness from about 200 Å to about 2000 Å. Examples of suitable materials for dielectric etch stop layer include silicon nitride, silicon oxynitride, boronitride, silicon boronitride and silicon carbide. In embodiments where the dielectric etch stop layer is silicon nitride and the dielectric layer is silicon dioxide, since silicon nitride has a relatively high dielectric constant compared to silicon dioxide, the thickness of the dielectric etch stop layer 22 should not be so great as to significantly decrease device performance (resulting from any increased capacitance).

Figure 7:
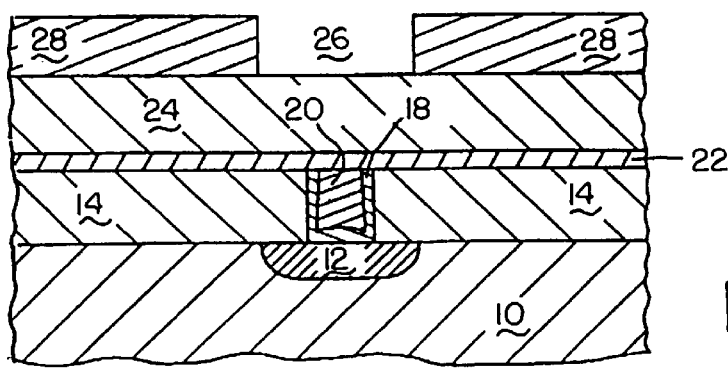
FIG. 7 illustrates a cross-sectional view of the semiconductor substrate of FIG. 6 after a dielectric layer, a patterned mask layer and an interconnect channel are formed according to one aspect of the present invention.
Figure 8:
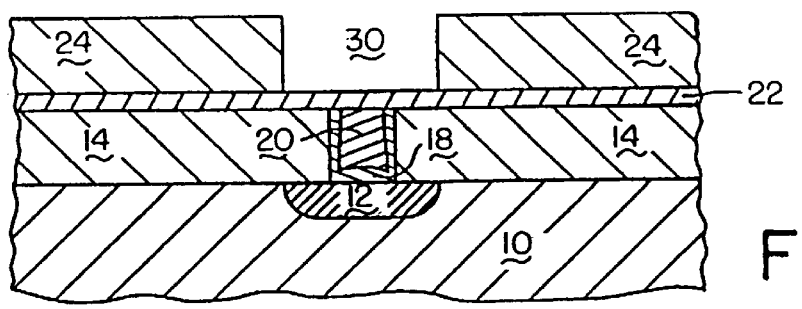
FIG. 8 illustrates a cross-sectional view of the semiconductor substrate of FIG. 7 after the dielectric layer is patterned according to one aspect of the present invention.

Referring to FIGS. 7 and 8, a patterned dielectric layer is formed over the substrate to define another opening. Specifically referring to FIG. 7, a dielectric layer 24 is initially formed over the dielectric etch stop layer 22. Dielectric layer 24 may include any suitable dielectric material or materials. Suitable dielectric materials include silicon dioxide, silicon oxynitride, phosphosilicate glass, borophosphosilicate glass, fluoro polymer, parylene, polyimide, any suitable spin-on glass, or any suitable spin-on polymer. Dielectric layer 24 may be formed to any suitable thickness using any suitable technique that may depend, for instance, on the material or materials used. For example, CVD techniques may be used to deposit a dielectric layer having a thickness from about 2,000 Å to about 10,000 Å. In a preferred embodiment, dielectric layer 24 is made of silicon dioxide.

Dielectric layer 24 is patterned to define an interconnect channel over at least a portion of the contact plug formed over diffusion region 12. Any suitable patterning technique may be used to define this interconnect channel in dielectric layer 24. For example, a patterned mask layer 28 may be formed over dielectric layer 24. Patterned mask layer 28 may include any suitable mask material such as a photoresist. Patterned mask layer 28 defines an opening 26 over the contact plug in dielectric layer 14.

Patterned mask layer 28 is used as a mask in etching dielectric layer 24 to form interconnect channel 26 as illustrated in FIG. 7. Any suitable etch technique may be used to etch dielectric layer 24. Preferably, a selective etch technique may be used to etch the material of dielectric layer 24 at a relatively greater rate as compared to the rate that the material of the mask layer 28 and the dielectric etch stop layer 22 are etched. In other words, the dielectric etch stop layer 22 serves as an etch-stop layer when etching dielectric layer 24.

In an embodiment where a photoresist is used for mask layer 28, silicon dioxide is used for dielectric layer 24, and silicon nitride is used for dielectric etch stop layer 22, a selective oxide:nitride etch technique may be used to etch dielectric layer 24 to define interconnect channel 26. This etch technique has selectivity to etch silicon dioxide from dielectric layer 24 without significantly etching silicon nitride from dielectric etch stop layer 22. Mask layer 28 is then removed from the substrate. The substrate may be optionally cleaned to remove residue from interconnect channel 26.

Interconnect channel 30 may be formed to have any desired cross-section, width or diameter, such as about 0.35 $\mu$m, about 0.25 $\mu$m, about 0.18 $\mu$m, about 0.15 $\mu$m, about 0.1$\mu$m and/or about 0.05 $\mu$m. The width of interconnect channel 30 may depend on the resistivity of the conductive material used for creating an interconnect with interconnect channel 30. Interconnect channel 30 may be relatively narrower where conductive material having a relatively lower resistivity is used to create an interconnect with interconnect channel 30. Interconnect channel 30 extends to the dielectric etch stop layer 22 exposing a portion of the dielectric etch stop layer 22 in dielectric layer 24.

Figure 9:
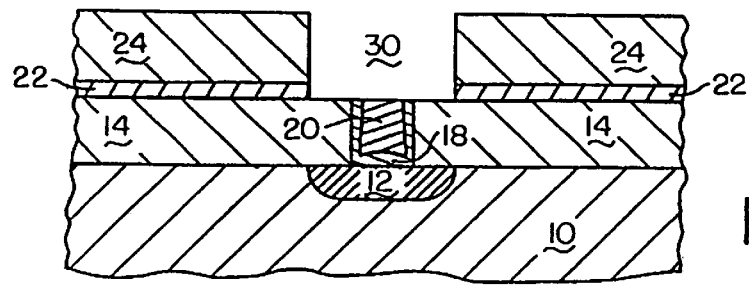
FIG. 9 illustrates a cross-sectional view of the semiconductor substrate of FIG. 8 after the dielectric etch stop layer is patterned according to one aspect of the present invention.

Referring to FIG. 9, a portion of the dielectric etch stop layer 22 exposed in the interconnect channel 30 is removed using any suitable technique depending upon the specific identity of the materials of the dielectric etch stop layer 22 and the dielectric layer 24. For example, a suitable selective etching technique may be employed to remove the portion of the dielectric etch stop layer 22 exposed in the interconnect channel 30. In an embodiment where silicon dioxide is used for dielectric layer 24, and silicon nitride is used for dielectric etch stop layer 22, a selective nitride:oxide etch technique may be used to etch dielectric etch stop layer 22 to define interconnect channel 30. This etch technique has selectivity to etch silicon nitride without significantly etching silicon oxide from dielectric layer 24. In other words, the etch gas etches in an anisotropic manner whereby there is no or very little change in side wall profile of the dielectric layer 24. After the dielectric etch stop layer exposed in the interconnect channel 30 is removed, the substrate may be cleaned using conventional techniques such as wet cleaning techniques. Removal of the exposed portion of the dielectric etch stop layer 22 serves to pattern dielectric etch stop layer 22 creating an opening in dielectric etch stop layer 22 that is approximately equal in width to interconnect channel 30.

Figure 10:
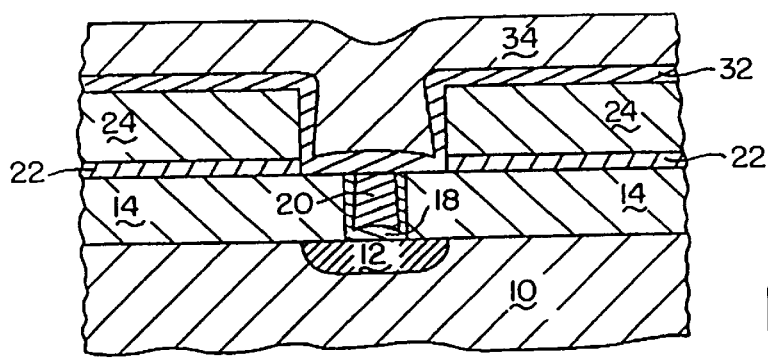
FIG. 10 illustrates a cross-sectional view of the semiconductor substrate of FIG. 9 after a tantalum layer and a conductive layer are formed according to one aspect of the present invention.

Referring to FIG. 10, the substrate including interconnect channel 30 is filled with a suitable conductive material or materials. For example, the substrate and interconnect channel 30 is filled with a tantalum barrier layer 32 and a conductive layer 34. The tantalum barrier layer 32 may serve as a diffusion barrier preventing materials from the conductive layer 34 from diffusing into dielectric layer 24 and/or dielectric layer 14. The tantalum barrier layer 32 is formed over the substrate so that it covers the side walls and bottom in interconnect channel 30. The tantalum barrier layer 32 may be formed using any suitable technique to a thickness sufficient to serve as a difflusion barrier for conductive layer 34. For example, the thickness of the tantalum barrier layer 32 may be in the range from about 300 Å to about 500 Å.

Conductive layer 34 is then formed over the substrate, substantially filling interconnect channel 30. The conductive layer may be made of any suitable conductive material or materials. Examples of suitable conductive materials include copper, tungsten, gold, silver, aluminum, any alloys and/or combinations thereof. In this embodiment, the conductive material is copper or a copper alloy. The conductive layer 34 may be formed to any suitable thickness using any suitable technique. For example, the thickness of the conductive layer 34 may range from about 0.1 $\mu$m to about 2 $\mu$m.

The tantalum barrier layer 32 and the conductive layer 34 may be deposited using CVD techniques. Alternatively, when copper is used as the conductive layer, the surface of the tantalum layer may be activated using copper atoms (copper seeds) by contact displacement followed by the autocatalytic deposition of electrolessly deposited copper.

Figure 11:
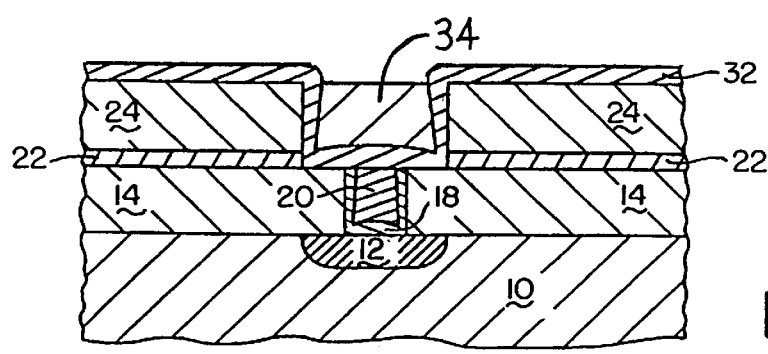
FIG. 11 illustrates a cross-sectional view of the semiconductor substrate of FIG. 10 after the conductive layer overlying the dielectric layer is removed according to one aspect of the present invention.

Referring to FIG. 11, conductive layer 34 is planarized to the surface of the tantalum barrier layer 32; that is, portions of the conductive layer 34 are removed from the top surface of tantalum barrier layer 32 above dielectric layer 24. Contact opening 26 remains substantially filled with a contact plug including portions of the tantalum barrier layer 32 and conductive layer 34. Any suitable technique may be used to planarize the substrate and may depend, for instance, on the specific identity of the material used to make the conductive layer 34. In one embodiment, the substrate is planarized (a portion of the conductive layer is removed) using CMP techniques using a polishing solution or slurry depending upon the specific identity of the materials used for the conductive layer 34. As a result of CMP techniques, dishing occurs wherein the conductive layer 34 is removed to a level below the top surface of the tantalum barrier layer 32, and in some instances, to a level just below the top surface of the dielectric layer 24.

Figure 12:
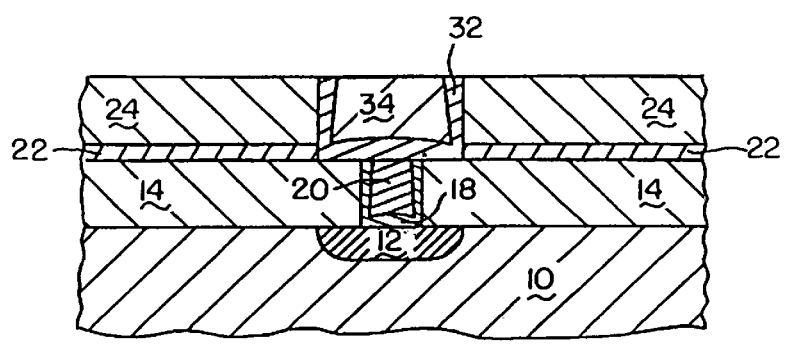
FIG. 12 illustrates a cross-sectional view of the semiconductor substrate of FIG. 11 after the tantalum layer overlying the dielectric layer is removed according to one aspect of the present invention.

Referring to FIG. 12, the portion of the tantalum barrier layer exposed over the dielectric layer 24 is removed using a tantalum etch gas mixture. The etching is performed using, for example, a two component gas combination of 355 sccm $CF_4$ and 420 sccm $O_2$ at a temperature of 125° C. under a pressure of 1.25 torr using about 1000 watts of power. After the portion of the tantalum barrier layer exposed over the dielectric layer 24 is removed, the substrate may be cleaned using conventional techniques such as wet cleaning techniques. Removal of the exposed portion of the tantalum barrier layer serves to planarize the substrate while leaving undisturbed the portion of the tantalum barrier layer 32 surrounding conductive layer 34. The tantalum etch gas mixture has high etch selectivity for tantalum as compared to a dielectric material such as silicon dioxide, which may constitute the dielectric layer 24 as well as other conductive metals such as copper or copper alloys, which may constitute the conductive layer 34. The tantalum etch gas mixture provides a selective etch such that the conductive layer 34 serves as a mask in etching the tantalum barrier layer 32. The tantalum etch gas mixture etches in an isotropic manner whereby there is no or very little change in side wall profile of the conductive layer 34.

When the underlying dielectric layer 24 is exposed to the tantalum etch gas mixture, the underlying dielectric layer 24 is preferably made of silicon dioxide so that it may serve as an etch-stop during etching of the tantalum barrier layer 32. In one embodiment, the tantalum etch gas mixture has a tantalum:dielectric layer etch selectivity of at least about 3:1. In another embodiment, the tantalum etch gas mixture has a tantalum:dielectric layer etch selectivity of at least about 4:1. In one embodiment, the tantalum etch gas mixture has a tantalum:conductive layer etch selectivity of at least about 60:1. In another embodiment, the tantalum etch gas mixture has a tantalum:conductive layer etch selectivity of at least about 70:1. Since the tantalum layer is partially removed by etching rather than using CMP techniques, bridging is not observed. In this embodiment, the tantalum etch gas mixture has a tantalum:dielectric layer etch selectivity of at least about 3.5:1 and a tantalum:conductive layer etch selectivity of at least about 65:1.

Although embodiments where the conductive layers 20 and 34 contain copper or a copper alloy have been described in FIGS. 1–12, it will be appreciated that some of these layers may contain different conductive materials, so long as at least one of the conductive layers is a copper or copper alloy layer. For example, in another embodiment of the invention, the procedures represented by FIGS. 1–12 are performed except that conductive layer 34 contains copper while conductive layer 20 contains tungsten or aluminum. In yet another embodiment of the invention, the procedures represented by FIGS. 1–12 are performed except that conductive layer 20 contains copper while conductive layer 34 contains tungsten or aluminum.

Generally referring to FIGS. 1–12, the methods disclosed herein may be used to create another via layer and another interconnect layer. In fact, it will be appreciated that the method can be used repeatedly to create multilayered structures with numerous via layers and/or interconnect layers.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of etching tantalum comprising:

etching at least a portion of tantalum using a tantalum etch gas mixture comprising $CF_4$ and oxygen and using from about 900 watts to about 1200 watts of power.

2. A method of etching tantalum disposed over a dielectric layer, comprising:

etching at least a portion of the tantalum using a tantalum etch gas mixture comprising from about 300 sccm to about 400 sccm of $CF_4$ and about 200 sccm to about 600 sccm of oxygen at a temperature from about 100° C. to about 150° C. under a pressure from about 1 torr to about 1.5 torr and using from about 900 watts to about 1200 watts of power.

3. The method of claim 2, wherein the tantalum etch gas mixture has a tantalum:dielectric layer etch selectivity of at least about 3:1.

4. The method of claim 2, wherein the tantalum etch gas mixture is at least one of nitrogen-free, sulfur-free, and hydrogen-free.

5. The method of claim 2, wherein the etching is performed in one of a reactive ion etch apparatus and an electron cyclotron resonance plasma reactor.

6. The method of claim 2, wherein the tantalum etch gas mixture comprises a ratio of $CF_4$ to oxygen from about 0.75:1 to about 0.95:1.

7. The method of claim 2, wherein the tantalum etch gas mixture further comprises a carrier gas.

8. The method of claim 2, wherein the tantalum has a thickness from about 300 Å to about 500 Å.

* * * * *